United States Patent [19]

Zipfel, Jr.

[11] 4,015,159

[45] Mar. 29, 1977

[54] SEMICONDUCTOR INTEGRATED CIRCUIT TRANSISTOR DETECTOR ARRAY FOR CHANNEL ELECTRON MULTIPLIER

[75] Inventor: George Gustave Zipfel, Jr., Madison, N.J.

[73] Assignee: Bell Telephone Laboratories, Incorporated, Murray Hill, N.J.

[22] Filed: Sept. 15, 1975

[21] Appl. No.: 613,218

[52] U.S. Cl. .......................... 313/95; 313/105 CM; 357/23

[51] Int. Cl.² .................. H01J 39/14; H01J 43/22; H01L 29/78

[58] Field of Search ..................... 313/103, 105, 95

[56] References Cited

UNITED STATES PATENTS

| | | | |
|---|---|---|---|
| 3,564,135 | 2/1971 | Weimer | 307/304 X |
| 3,638,202 | 1/1972 | Schroeder | 307/304 X |
| 3,651,349 | 3/1972 | Kahng et al. | 307/304 |
| 3,699,375 | 10/1972 | Weibel | 313/98 X |
| 3,811,076 | 5/1974 | Smith | 307/238 X |
| 3,849,678 | 11/1974 | Flynn | 307/311 |
| 3,872,491 | 3/1975 | Hanson et al. | 329/101 |
| 3,879,626 | 4/1975 | Washington et al. | 313/105 |

FOREIGN PATENTS OR APPLICATIONS

| | | |
|---|---|---|
| 979,687 | 1/1965 | United Kingdom |
| 1,126,088 | 9/1968 | United Kingdom |

OTHER PUBLICATIONS

Roberts et al., Abstracts of Papers; Carleton University; Ottawa, Canada; June 24–26, 1975.
Colson et al., High-gain Imaging Electron Multiplier, Rev. Sci. Instrum., vol. 44, No. 12; Dec., 1973; pp. 1694–1696.

Primary Examiner—Robert Segal
Attorney, Agent, or Firm—D. Caplan

[57] ABSTRACT

In a channel electron multiplier device for detecting low level illumination optical image patterns, the output pattern of electrons is detected by an XY array of metal plates which are randomly accessed for readout by a corresponding row-column (XY) array of dual-gated insulated gate field effect transistors in an integrated circuit type of configuration. More specifically, each metal plate is located in the path of several (typically, ten or more) individual electron multiplier channels, in order to store the electrons emerging from these channels. The plates are all situated on the exposed surface of an insulating layer on a major surface of a semiconductor wafer. Each plate is connected through a different aperture in the insulating layer to a different localized source region of a different dual-gated insulated gate field effect transistor whose gate region is controlled by XY access control bus electrodes. These XY control bus electrodes are sandwiched in the insulating layer at levels in the insulator between the metal plates and the semiconductor wafer. Random XY access readout of the intensity of the electrons impinging on a given metal plate is obtained by energizing the crosspoint X and Y bus electrodes associated with that plate, and thereby the corresponding local intensity of the optical image portion, which produced the original photoelectrons in the channel multipliers associated with the accessed metal plate, can be determined.

10 Claims, 5 Drawing Figures

SEMICONDUCTOR INTEGRATED CIRCUIT TRANSISTOR DETECTOR ARRAY FOR CHANNEL ELECTRON MULTIPLIER

FIELD OF THE INVENTION

This invention relates to optical or electron image detector apparatus, and more particularly to random access readout for channel photoelectron multipliers.

BACKGROUND OF THE INVENTION

In the detection of optical image patterns of relatively low illumination intensity levels of the order of, or below, $10^{-11}$ watts per square centimeter, it is desirable to use a channel electron multiplier device for the purpose of converting the optical image pattern into a corresponding electron beam pattern. Such a device produces typically thousands of individual channel multiplier electron beams whose intensities are in accordance with corresponding portions of the optical image. In conjunction with such a channel electron multiplier, it would be desirable to have a compact sized detector for storing the electron channel beam cross-section pattern in a form which can be randomly accessed for readout at any desired portion, or combination of portions, of the cross section at any selected moment of time while the other portions of the device continue to store the electrons of the remaining electron beams, and hence continue to store the electrons of the remaining corresponding portions of the optical image pattern cross section for subsequent similar random access readouts.

SUMMARY OF THE INVENTION

In order to provide a detector for a channel electron multiplier, with random access readout capability, a semiconductor integrated circuit is constructed comprising an array of "dual" gated insulated gate field effect transistors. Each such dual gated transistors is turned "on" only if both gates of the transistor are simultaneously energized by an applied electrical signal. The dual gate electrode pair of each transistor is sandwiched in the insulating layer between a different overlying metal plate and a single underlying semiconductor wafer substrate. Each metal plate is advantageously in the path of a group of many electron channels, typically 10 or more, of a channel electron multiplier, and thereby each plate can store the sum of the electrons from the corresponding many channels of the group. Each such plate is also connected through a contact hole in the insulating layer to the source region of the corresponding dual-gated transistor integrated into the semiconductor substrate. Upon energizing both gates of a given one of such transistors, as by crosspoint array access techniques, the charges stored in the corresponding metal plate can be accessed for readout to indicate the optical image intensity at the corresponding position of the image pattern which is then incident on the channel multiplier.

In a specific embodiment of the invention, an orthogonal XY array of metal plates is located on the exposed surface of an insulating oxide layer on a semiconductive silicon wafer substrate. Each plate is connected through a contact window in the oxide to a source region of a different dual-gated insulated gate field effect transistor of a corresponding array of such transistors. The gate region of each transistor is controlled by a pair of dual gate electrodes sandwiched in the oxide between the corresponding metal plate and the semiconductor wafer. The drain region of each of the transistors is connected to common output bus electrode for detection of of the charge stored on the metal plate associated with the transistor whose corresponding dual gate electrodes are both simultaneously energized to turn the transistor into the on state. The dual gates are accessed by XY crosspoint electrode metallization. Thus, a given transistor $X_m Y_n$ can be turned on by energizing the $X_m$ and the $Y_n$ electrodes, and hence the charge stored on the corresponding metal plate can be read out as the response in the output bus electrode. Also, several dual-gated transistors can be simultaneously turned on, for readout of a predetermined combination of metal plates.

An advantageous feature of shielding of the metal plates from the semiconductor wafer substrate is achieved by virtue of the geometry of the electrode metallization of output bus, as well as metallization of dual gate electrodes, which together can effectively shield the plates from the substrate. This shielding therefore reduces undesired electrical interaction between the charges in metal plates and the underlying surface regions of semiconductor, which might otherwise cause spurious leakage paths along the surface of the semiconductor wafer.

BRIEF DESCRIPTION OF THE DRAWING

This invention together with its features, objects, and advantages may be better understood from the following detailed description when read in conjunction with the drawing in which.

DETAILED DESCRIPTION

Figure 1:
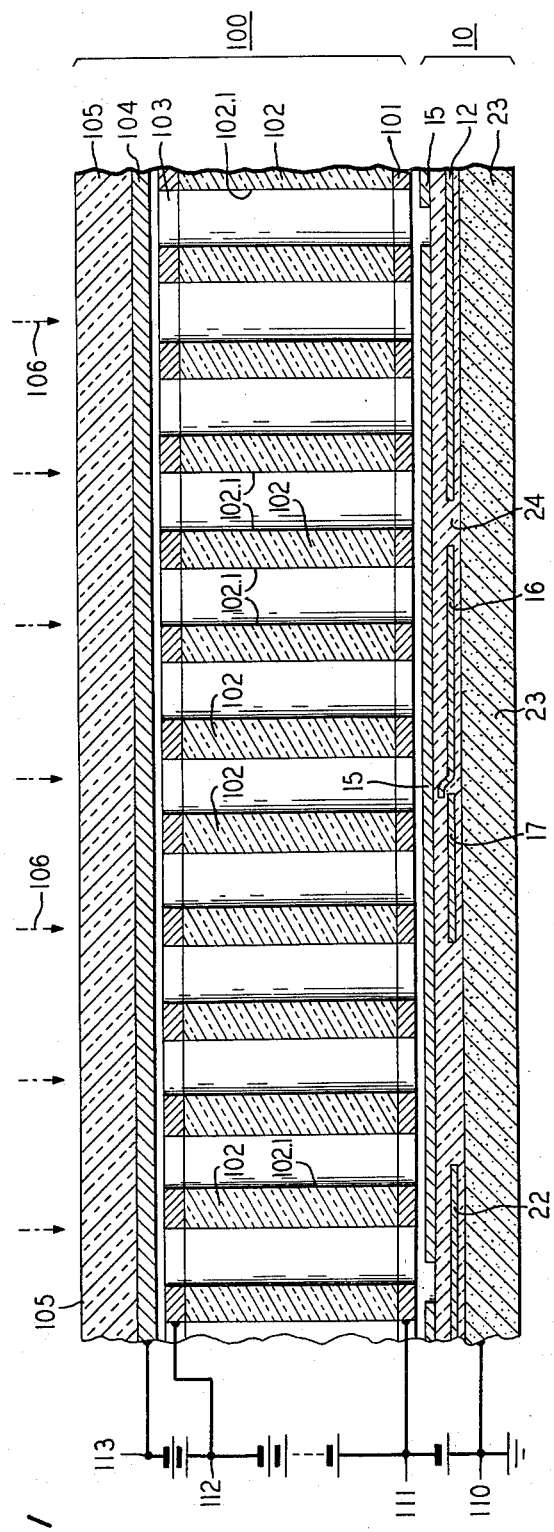
FIG. 1 is a cross-section diagram of a channel electron multiplier with a random access electron beam detector in accordance with a specific embodiment of the invention.

As shown in FIG. 1, a multichannel photoelectron multiplier 100 is situated with its output end attached to a semiconductor detector 10, both of these elements being in a vacuum. In operation, a beam 106 of optical radiation, whose image pattern to be detected, is incident on a photoemissive cathode ("photocathode") layer 104 through a galss plate 105. The photoconductive layer 104 produces photoelectrons in a cross-section pattern in accordance with the image pattern of the beam 106, which ordinarily should be slowly varying over regions comparable to the cross section of a metal plate 15 of the electron detector 10. These electrons are accelerated by reason of the voltage difference across terminals 113 and 112 of a D.C. battery. This voltage difference is applied across the photocathode layer 104 and an apertured metallized rear surface layer 103 of an array of hollow insulating glass fiber material columns 102 forming an array of multiple electron multiplier channels. The side surfaces 102.1 of these fiber columns have been treated, as known in the art, for producing electron multiplication along the separate channel paths, defined by the hollow insulating columns 102, as the electrons travel from the apertured metallized rear surface layer 103 and a similar metallized front surface layer 101. These electrons are propelled along the multiplier channels by a voltage potential difference applied across terminals 111 and 112 of the front and rear metallized surface layers 101 and 103. The thus multiplied electrons in the various channels arrive at an array of metal plates 15 of the detector 10 for random access detection thereat.

The photocathode 104 is typically a layer of essentially $Na_2KSb(C_s)$. The space between this photocathode layer 104 and the metallized rear surface layer 103 is typically about 0.2 millimeter, across which a voltage typically between about 30 and 100 volts is applied at terminals 112 and 113. The length of the insulating columns 102, and hence the distance between front and rear metallized surface layers 101 and 103 is typically about 1 to 3 millimeters, across which a voltage of about 1 to 4 kilovolts is applied at terminals 111 and 112. The space between the front metallized surface layer 101 and the metal plates 15 is typically about 0.2 millimeter, across which a voltage, typically in the range of about +20 volts to −10 volts, is applied at terminals 110 and 111, in order that the multiplied electrons impinge directly on the metal plates 15 for temporary storage thereat.

Figure 2:
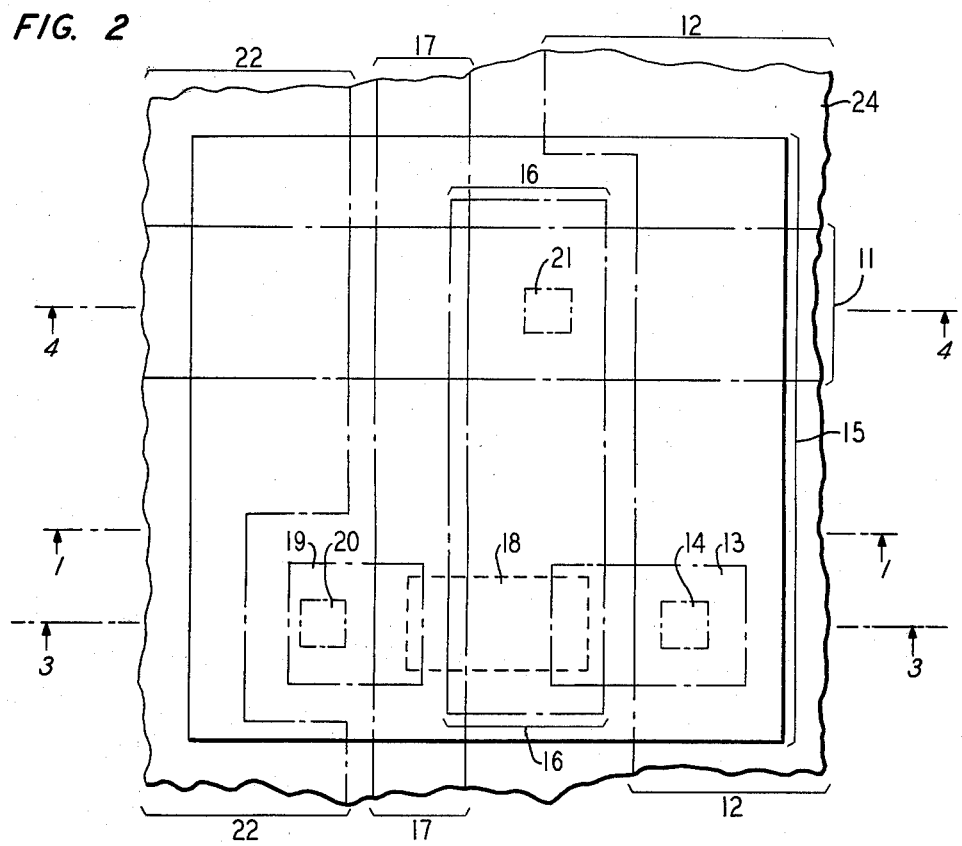
FIG. 2 is a top view diagram of the random access electron detector illustrated in FIG. 1.
Figure 3:
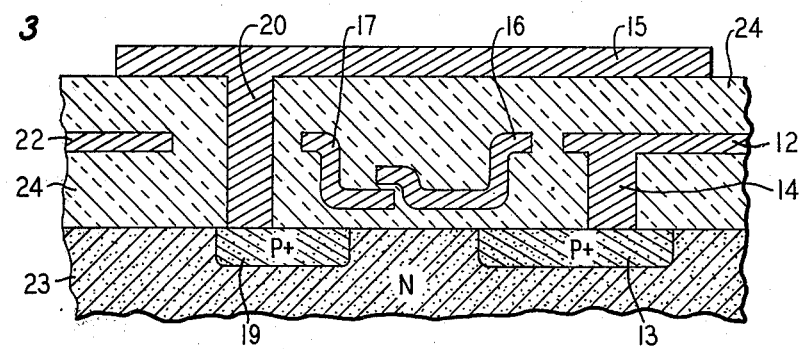
FIG. 3 is a cross-section diagram of a section of the detector illustrated in FIG. 2.
Figure 4:
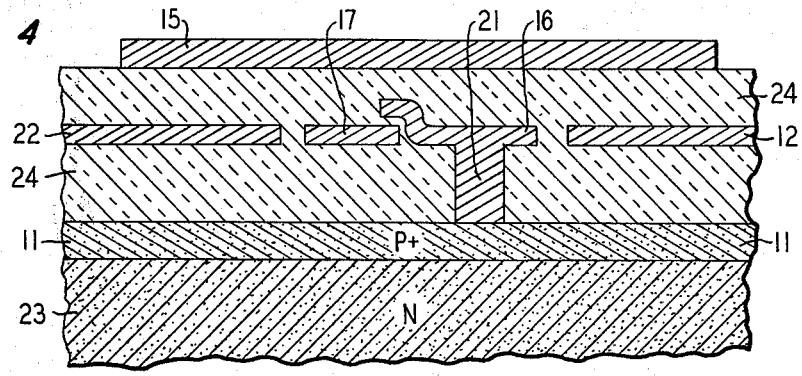
FIG. 4 is a cross-section diagram of a different section of the detector illustrated in FIG. 2.

FIG. 2 shows a plan of (a portion of) the semiconductor detector 10. While only one full plate 15 is illustrated, it should be understood that a rectangular array of such plates is to be included in a complete random access detector of which FIG. 2 illustrates only a portion including the one full metal plate. The metal 15 overlies an insulating silicon dioxide layer 24 on a semiconductor silicon substrate 23 (FIGS. 3 and 4). This substrate is typically of relatively low electrical conductivity monocrystalline silicon having N-type substantially uniform bulk electrical conductivity of about 5 ohm-cm. Each plate 15 is typically an essentially aluminum or gold, 40 to 100 micron square and about 0.5 micron thick, which has been selectively plated or deposited on the exposed surface of the silicon dioxide layer using, for example, known geometrical selective masking and etching techniques. The metal plate 15 has a protruding electrically connecting contact portion 20 (FIG. 3), of the same material as the plate, for electrically connecting the plate to a localized $P^+$ type conductivity surface zone 19 in the substrate 23 through an aperture in the silicon dioxide layer 24. This $P^+$ zone 19 typically has an excess acceptor impurity concentration of the order of $5 \times 10^{18}$ per cubic centimeter, and is typically about 10 microns square by 3 microns in depth. An output bus electrode 12, typically of aluminum or polysilicon, is located in the silicon dioxide layer 24 at a distance level from the substrate of typically about 1 to 3 microns ("thick oxide"). This output bus electrode 12 is electrically connected to a localized $P^+$ type surface zone 13 by a protruding electrically connecting contact portion 14, of the same material as the electrode 12 itself, through the silicon dioxide layer 24. This $P^+$ zone 13 is similar in structure to the previously described $P^+$ zone 19, except that, in order to reduce masking tolerances during fabrication, the zone 13 is advantageously about half again as long in the direction of the channel between this pair of $P^+$ zones 13 and 19. The pair of these localized $P^+$ zones 13 and 19 function as source and drain regions, respectively, of an insulated gate field effect transistor which is dual-gated by Y bus gate electrode 16 and X bus gate electrode 17, typically of polysilicon or aluminum metallization. The gate electrode 17 advantageously overlaps the gate electrode 16 in at least a portion of a "thin oxide" region 18, typically 0.1 to 0.3 microns thick, overlying the channel between the $P^+$ zones 19 and 13. The electrode 16 is everywhere separated from the electrode 17 by at least 0.1 to 0.3 microns of oxide, for mutual insulation. It should be understood that this thin oxide region 18 is coated with further silicon dioxide to become a "thick oxide" region of thickness typically of 1 to 3 microns in the final device structure, as indicated in FIG. 3, at which level the electrodes 12 and 22 are located; and that this thick oxide is itself coated by still more silicon dioxide, typically 0.3 microns or more in thickness, upon whose exposed upper surface is located the metal plate 15. In the area of the silicon dioxide layer 24 removed from this channel, these gate electrodes extend over the thick oxide region level, typically about 1 to 3 microns thick silicon dioxide. As indicated in FIG. 4, a connecting contact portion 21 of a Y gate electrode 16 electrically connects this electrode to a Y gate $P^+$ bus strip zone 11 (FIG. 2) running along the surface of the substrate 23. This $P^+$ strip 11 is advantageously formed similarly to, and at the same time as, the $P^+$ zones 19 and 13 and is typically about 10 to 15 microns wide.

Another output bus electrode 22, which is also ultimately electrically connected in common with the output bus electrode 12 (FIG. 5) advantageously shields otherwise unshielded portions of the substrate from the metal plate as well as serves as the output bus connection to the next adjacent metal plate (not shown) at a distance of separation of typically about 50 microns to the left of the metal plate 15 (FIS. 3 and 4). This shielding effect of output bus electrode 22 is desirable in order to prevent interaction between electrons being collected in the metal plate and the substrate, which would otherwise cause undesirable electrical leakage channels along the surface of the substrate particularly between (FIG. 2) the $P^+$ zone 19 and the output $P^+$ bus strip 11.

In order to fabricate the detector 10, the following procedure is but suggestive of one of the many possible ways therefor. While this procedure will be outlined in terms of but a single memory storage cell, comprising a single metal plate 15 and its associated elements, it should be understood that all such cells in the array of the detector 10 are being formed simultaneously in accordance with known techniques of mass fabrication of integrated circuits. First, a "thick" oxide layer is formed everywhere on the top major surface of the substrate. Then, using standard photolithographic selective masking and etching techniques, apertures are produced in this thick oxide at the to-be-formed localized $P^+$ zones 13, 19, and the $P^+$ bus strip 11, of these apertures. After this selective diffusion, the remaining oxide is removed by etching and a fresh thick oxide coating is regrown all over the top surface of the substrate. Then, this regrown thick oxide is etched selectively, exposing the substrate at the to-be-formed "thin" oxide layer region 18. Next, this thin oxide layer is grown of good gate quality silicon dioxide in this thin oxide region 18. At this point in the fabrication, a contact aperture may be optionally formed by selectively etching the thick oxide in the area of the (to be formed) connecting portion 20 of the (to be formed) metal plate 15. Then, electrode gate bus 17 is formed by the polysilicon gate technique (or by depositing aluminum), followed by oxidation (or anodization) of the exposed top surface of the electrode in order to insulate it electrically from the gate electrode 16 which is yet to be formed. Next, contact apertures in the thick oxide are formed for the connecting portion 14 of the output bus electrode 12 and for the connecting portion 21 of the gate electrode 16. The gate electrode 16 is then formed by a similar technique as the previously formed gate electrode 17, such that the gate electrode 17 overlaps the gate electrode 16 by about 2 microns. At the same time the gate electrode 16 is being formed with its connecting contact portion 21, simultaneously the output bus electrode 12 (and 22) is similarly being formed with its connecting contact portion 14. An aperture is then (re-) opened for the contact portion 20 of the metal plate 15 yet to be formed. Then the top exposed surface of all electrodes is oxidized (or anodized, or else coated with insulating silicon dioxide) for electrical insulation from the metal plate 15 which is thereafter deposited as by chemical vapor deposition of aluminum. At the same time as the metal plate 15 is being formed, advantageously peripheral external electrical contacts at the ends of the bus electrodes are also formed. It should be understood that the exposed surface of the metal plate 15, as fabricated in this way, will not be a flat plane but will have a wavy contour due to the multilevel structure of the underlying gate electrodes (and hence wavy contour of the oxide's exposed surface on which the metal plate lies); but this nonplanar characteristic of the surface of the metal plate will not adversely affect performance.

Figure 5:
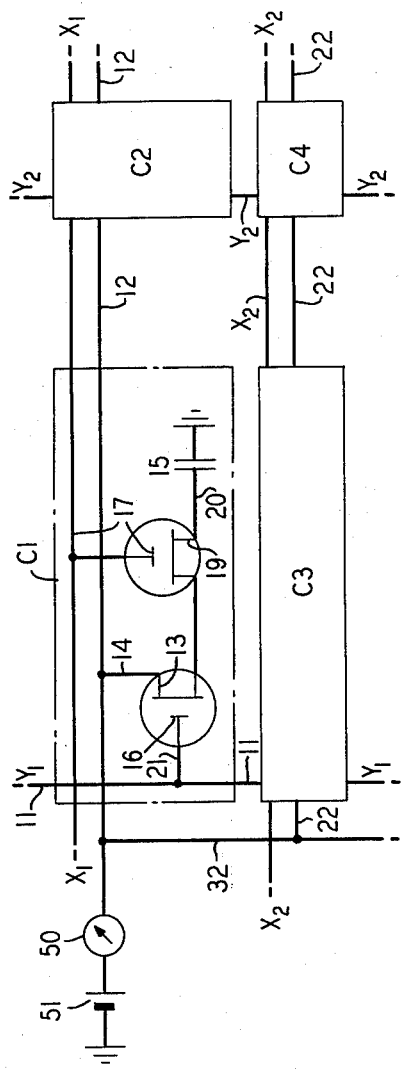
FIG. 5 is an equivalent circuit diagram of the random access electron beam detector illustrated in FIG. 2.

As indicated above, whereas only one metal plate 15 is illustrated in FIGS. 2–4, it is to be understood that an array of such metal plates is to be laid down on the top surface of the silicon dioxide layer 24, each plate forming an electrical capacitor for collecting and storing electrons coming from the photocathode 104 (FIG. 1). Each plate is associated with dual-gated electrode means, all advantageously integrated in the single semiconductor substrate 23. An electrical circuit diagram representative of the array of metal plates 15 is shown in FIG. 5. For the sake of clarity, only one random access storage cell $C_1$ is shown in detail, in conjunction with block diagrams $C_2$, $C_3$ and $C_4$ representing substantially identical neighboring random access storage cells. Elements in the cell $C_1$ corresponding to the previously described elements of FIGS. 2–4 are labeled with the same reference numerals. The previously described dual-gated insulated gate field effect transistor of the cell is represented in FIG. 5 equivalently by a pair of separate single-gated transistors, for the sake of ease of understanding of the electrical operation. The output bus electrodes 12 and 22 are advantageously interconnected by a single electrode or wire lead 32 located at the left-hand edge of the extreme left-hand cell of each row of cells, it being assumed that the cells $C_1$ and $C_3$ are the left-hand-most cells in the first and second rows controlled by X bus gate electrodes $X_1$ and $X_2$, respectively. One of the dual gate electrodes, 17, is connected to the $X_1$ row bus; while the other gate electrode 16 is connected to a Y column bus $Y_1$, furnished by the previously described $P^+$ strip 11. Voltages suitable for turning the transistors on (producing a channel inversion layer under the gate electrode) are applied to energize the particular X bus (or buses) and Y bus (or buses) at whose crosspoint(s) it is desired to read out the stored electron charge on the metal plate(s) 15. It should be noted that if, for example, the $X_1$ bus is energized for turning on by inversion of the $X_1$ row gate semiconductor surface channels underneath all gate electrodes 17 in the $X_1$ row; nevertheless, in the absence of a simultaneous energizing of the $Y_1$ column bus, the electron charge stored on the metal plate 15 cannot be neutralized thereby with any charge flow from the source region 13 since no electrical current can then flow, the channel between source 13 and drain 19 not being then inverted (electrically conductive) along a complete path therebetween. However, if both the $X_1$ row bus and the $Y_1$ column bus are energized, then a complete channel between source 13 and drain 19 is inverted, so that hole charge carriers flow from source to drain thereby neutralizing the stored electrons on the plate 15, thereby causing a current flow in the output bus 12. This current is detected by an output current or charge detector 50 on the output bus, where a D.C. battery 51 supplies a bias voltage of about 10 to 25 volts, typically about 20 volts as a bias for the drains 13 of the field effect transistors. Moreover, more than a single row X and/or column Y bus can be simultaneously energized, so that the output detector 50 then can detect current or charge corresponding to the more than one storage cell located at the corresponding XY crosspoints of energized bus row(s) and column(s).

It should be understood that the electrons arriving at the metal plates 15 should arrive thereat with kinetic energies less than about 50 volts, so that secondary emission of electrons from the plate is kept negligible. Accordingly, the voltage of the battery between terminals 110 and 111 should be adjusted to be of this magnitude of less than about 50 volts, typically about 20 volts or less. It should also be noted that these electrons stored in the plate 15 produce a reverse bias on the PN junction located at the mutual boundary of the $P^+$ zone 19 and the substrate 23, which is useful as an electrically insulating barrier against leakage of stored electrons into the substrate. Thus, the "P-channel" type transistors (FIGS. 3–4) are preferred in the practice of this invention. Moreover, the enhancement mode type of P-channel is also preferred, in order to suppress charge leakage without the need of applied voltages.

While this invention has been described in detail in terms of a specific embodiment, various modifications can be made without departing from the scope of the invention. For example, although the metal plates 15 will ordinarily take the form of substantially identical squares (plan view of FIG. 2) in an orthogonal XY array, other forms for the plates such as rectangles or parellelograms may be used in conjunction with orthogonal or nonorthogonal XY arrays or other types of arrays with corresponding orthogonal or nonorthogonal interconnection patterns of access and output bus electrodes.

What is claimed is:

1. Semiconductor apparatus which comprises
   a. a semiconductor wafer of essentially one type relatively low electrical conductivity including an array of essentially mutually parallel relatively high conductivity elongated common bus strip regions of opposite type conductivity in said wafer, each of said bus regions being bounded on one side by a major surface of the semiconductor wafer;
   b. an insulating layer coating said major surface of the semiconductor wafer;

c. an array of metal plates located on an exposed surface of the insulating layer for collecting electrons incident on said plates;
d. electrically conductive means for connecting each metal plate through a different aperture in the insulating layer to a different localized surface zone in a first array of localized surface zones in said wafer, said localized zones of opposite type conductivity to said one type in said wafer, each said zone being isolated from all the strip regions;
e. a second array of localized surface zones of said opposite type conductivity in said wafer, each said zone in the second array being isolated from all the strip regions and from all the zones in the first array, each zone in the second array located proximate to a corresponding zone in the first array, each zone of the second array being connected to an output bus electrode through a different aperture in the insulating layer; and
f. dual electrode gating means located in said insulating layer for controlling the surface conductivity of the semiconductor wafer between each localized zone of the first array and its said corresponding proximate localized zone in the second array, one of said electrode means being connected to one of the common bus regions through an aperture in the insulating layer and the other of said electrode means being elongated to form a common bus electrode essentially orthogonal to the common bus regions.

2. Apparatus according to claim 1 in which the semiconductor is silicon.

3. Apparatus according to claim 2 in which the insulating layer is silicon dioxide.

4. Apparatus according to claim 3 in which the array of metal plates is two-dimensional and in which each metal plate is located at the outlet end of of a plurality of different electron multiplier channels.

5. Apparatus according to claim 4 which further includes photocathode means located at the inlet end of the electron multiplier channels for producing a pattern of electrons in the channels in accordance with an optical image pattern on the photocathode.

6. Apparatus for selectively detecting an optical image pattern which comprises
a. photocathode means for producing electrons in response to the optical image;
b. an array of electron multiplier channels, each channel having an outlet end an inlet end, whose inlet ends are located proximate to the photocathode means in order to produce a pattern of electrons at the outlet ends of the channels in accordance with the pattern of intensity of the optical image;
c. a detector of said pattern of electrons which comprises
an array of metal plates, each of which is located at the outlet end of at least one different channel, for collecting the electrons arriving at the outlet end of the channels, said plates located on the exposed surface of an insulating silicon dioxide layer on a semiconductive silicon wafer of relatively low electrical conductivity of essentially one type, each of said plates being connected to a different localized surface zone in a first array in said wafer of localized surface zones of relatively high electrical conductivity of opposite type to said one type, each of said localized zone in the first array being located in close proximity to and separated by a predetermined distance from a different localized surface zone of relatively high electrical conductivity of said opposite conductivity type in a second array of surface zones in said wafer, thereby defining a surface channel of said predetermined distance in the wafer between each localized surface zone in the first array and the different localized surface zone in the second array, said channel being controlled by a pair of dual gate electrodes located in the insulating layer overlying said channel, and each localized zone of the second array being conductively connected through a different aperture in the insulating layer to an output bus electrode.

7. Apparatus according to claim 6 in which the array of metal plates is two-dimensional and in which each metal plate encompasses a plurality of different corresponding channels, so that the electrons collected by each plate correspond to the electrons arriving at the outlet ends of the plurality of corresponding channels.

8. Apparatus according to claim 7 in which one of the dual gate electrodes of each pair is connected to a common Y-direction access bus, formed by a surface region of relatively high electrical conductivity of said opposite type at the surface of the semiconductive wafer elongated in the Y-direction, for controlling access to the metal plates with the same mutual X coordinate.

9. Apparatus according to claim 8 in which the oter of the dual gate electrodes of each pair is a common X-direction access bus elongated in the X direction for controlling access to the metal plates located with the same mutual Y coordinate.

10. Apparatus according to claim 9 in which X and Y are orthogonal coordinates and in which the top surface of the metal plates is at least approximately square in shape.

* * * * *